United States Patent
Teragawa

(10) Patent No.: US 11,054,693 B2
(45) Date of Patent: Jul. 6, 2021

(54) ILLUMINATING DEVICE AND DISPLAY APPARATUS

(71) Applicant: SAKAI DISPLAY PRODUCTS CORPORATION, Sakai (JP)

(72) Inventor: Daisuke Teragawa, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/495,750

(22) PCT Filed: Mar. 29, 2017

(86) PCT No.: PCT/JP2017/013075
§ 371 (c)(1),
(2) Date: Oct. 30, 2019

(87) PCT Pub. No.: WO2018/179184
PCT Pub. Date: Oct. 4, 2018

(65) Prior Publication Data
US 2020/0096797 A1     Mar. 26, 2020

(51) Int. Cl.
*G02F 1/1333* (2006.01)
*G02F 1/1335* (2006.01)
(Continued)

(52) U.S. Cl.
CPC ............ *G02F 1/1336* (2013.01); *F21S 2/00* (2013.01); *G02F 1/133308* (2013.01);
(Continued)

(58) Field of Classification Search
CPC ............ G02F 1/1336; G02F 1/133308; G02F 1/133385; G02F 1/133603;
(Continued)

(56) References Cited

U.S. PATENT DOCUMENTS 7,651,249 B2 * 1/2010 Ohashi .............. G02F 1/133308
362/373
7,894,014 B2     2/2011 Kawase et al.
(Continued)

FOREIGN PATENT DOCUMENTS

JP     2006-073432 A     3/2006
JP     2008-034342 A     2/2008
(Continued)

*Primary Examiner* — Arman B Fallahkhair
(74) *Attorney, Agent, or Firm* — ScienBiziP, P.C.

(57) ABSTRACT

An illuminating device (200) according to the present invention is provided with: a substrate (4) having a surface, on which a plurality of light sources (3) are mounted; a housing (12), in which an opening is defined; a diffusion plate (9) that is disposed facing a bottom plate section (50) so as to close the opening; a duct (14) having an air inlet (23) and an air outlet (24); a fan (15) that generates an airflow in the duct (14); a first flow channel (P1); and a second flow channel (P2). The first flow channel (P1) communicates a space inside of the housing (12) closed by the diffusion plate (9) with the inside of the duct (14). The housing (12) is connected to, via a first opening (55) that is provided at the bottom plate section (50) or a side plate section (52), a venturi section (140) that is formed between the air inlet (23) and the air outlet (24) of the duct (14). Without being connected to the duct (14), the second flow channel (P2) communicates the inside and the outside of the housing (12) with each other via a second opening (56) that is provided at the bottom plate section (50) or the side plate section (52).

17 Claims, 8 Drawing Sheets

(51) Int. Cl.
  *G02F 1/13357*  (2006.01)
  *H05K 7/20*  (2006.01)
  *F21S 2/00*  (2016.01)

(52) U.S. Cl.
  CPC .. *G02F 1/133385* (2013.01); *G02F 1/133603* (2013.01); *G02F 1/133606* (2013.01); *G02F 1/133608* (2013.01); *H05K 7/20145* (2013.01); *H05K 7/20972* (2013.01); *G02F 1/133314* (2021.01); *G02F 1/133317* (2021.01); *G02F 1/133607* (2021.01); *G02F 1/133628* (2021.01)

(58) Field of Classification Search
  CPC ......... G02F 1/133606; G02F 1/133608; G02F 2001/133314; G02F 2001/133317; G02F 2001/133628; G02F 1/133607; G02F 1/133314; G02F 1/133628; G02F 1/133317; H05K 7/20145; H05K 7/20972; F21S 2/00
  See application file for complete search history.

(56) References Cited

U.S. PATENT DOCUMENTS

| | | | |
|---|---|---|---|
| 8,248,784 | B2* | 8/2012 | Nakamichi ........ H05K 7/20972 361/679.5 |
| 9,316,862 | B2 | 4/2016 | Shibata et al. |
| 9,456,525 | B2* | 9/2016 | Yoon ..................... G06F 1/20 |
| 10,485,147 | B2* | 11/2019 | Oh ..................... H05K 7/20963 |
| 2006/0050512 | A1 | 3/2006 | Nakagawa et al. |
| 2008/0111949 | A1 | 5/2008 | Shibata et al. |
| 2009/0135330 | A1 | 5/2009 | Kawase et al. |
| 2012/0255721 | A1* | 10/2012 | Kim ..................... G09F 13/04 165/288 |
| 2013/0222754 | A1* | 8/2013 | Kohtoku ............... H01T 23/00 349/161 |

FOREIGN PATENT DOCUMENTS

| | | |
|---|---|---|
| JP | 2009-129707 A | 6/2009 |
| JP | 2009-266512 A | 11/2009 |
| JP | 2009-266625 A | 11/2009 |

* cited by examiner

ILLUMINATING DEVICE AND DISPLAY APPARATUS

TECHNICAL FIELD

The present invention relates to an illuminating device, and a display apparatus equipped with the illuminating device.

BACKGROUND ART

There is a backlight as an example of an illuminating device. Such a backlight is used to illuminate a liquid-crystal panel in a liquid-crystal display as an example of a display apparatus. The backlight has light sources mounted on a substrate, and a housing that confines light emitted from the light sources. When the backlight is lit, the light sources of the backlight generate heat. Insufficient release of generated heat to the outside of the housing may cause the occurrence of a display defect of the liquid-crystal panel because liquid-crystal molecules filled in the liquid-crystal panel are denatured at high temperatures. In recent liquid-crystal display apparatuses, the luminance has particularly been increased. Increasing luminance arises a significant issue about heat dissipation because of an increase in the number of light sources used for the liquid-crystal display apparatuses, and in an amount of an input current into the light sources.

For example, Patent Literature 1 discloses a liquid-crystal display apparatus having the structure in which a substrate on which light sources as a heat source are mounted is attached to a metal bottom chassis as part of a housing.

CITATION LIST

Patent Literature

[Patent Literature 1] JP 2009-129707A

SUMMARY OF INVENTION

Technical Problem

Increasing the number of light sources or an input current into the light sources to increase luminance of all the light sources causes, at the same time, an increase in a quantity of heat generated from all the light sources. In this case, in the heat dissipation structure of the liquid-crystal display apparatus of Patent Literature 1, a display defect may occur by a rise in temperature of the liquid-crystal panel or the like as a result of insufficient release, outside the housing, of heat from the substrate.

An object of the present invention is to provide an illuminating device capable of suppressing a rise in internal temperature of a housing, and a display apparatus including the illuminating device.

Solution to Problem

An illuminating device according to an aspect of the present invention includes a substrate, a housing, a diffusion plate, a duct, an air flow generator, a venturi section, a first flow channel, and a second flow channel. The substrate has a surface on which light sources are mounted. The housing has a bottom plate section that holds the substrate, and a side plate section that surrounds the bottom plate section. Here, an opening is defined by an end of the side plate section. The diffusion plate is disposed to face the bottom plate section and close the opening. The duct has an air inlet and an air outlet. The air flow generator generates an air flow inside the duct. The venturi section is formed between the air inlet and the air outlet of the duct such that an internal space of the housing closed with the diffusion plate communicates with an inside of the duct. The first flow channel is connected through a first opening provided at the bottom plate section or the side plate section. In the second flow channel, through a second opening provided at the bottom plate section or the side plate section, an outside of the housing is not connected to the duct but communicates with an inside of the housing.

A display apparatus according to an aspect of the present invention includes the illuminating device, a display panel, and an enclosure. The display panel has a display surface that displays an image. The display panel controls transmittance of light, incoming from an opposite surface of the display panel from the display surface through the diffusion plate, emitted from the light sources, thereby generating the image. The enclosure houses the display panel, the diffusion plate, the substrate, and the housing. The duct and the air flow generator are disposed between the bottom plate section and a facing section of the enclosure that faces the bottom plate section.

A display apparatus according to an aspect of the present invention includes the illuminating device, a display panel, and an enclosure. The display panel has a display surface that displays an image. The display panel controls transmittance of light, incoming from an opposite surface of the display panel from the display surface through the diffusion plate, emitted from the light sources, thereby generating the image. The enclosure houses the display panel, the diffusion plate, the substrate, and the housing. The air flow generator is disposed between the bottom plate section and a facing section of the enclosure that faces the bottom plate section. The duct is composed of fin-shaped projections formed on at least one of the bottom plate section, or the facing section.

Advantageous Effects of Invention

In the illuminating device and the display apparatus with the same according to an aspect of the present invention, the Venturi effect by the venturi section enables release, outside the housing, of the internal air of the housing warmed by the heat from the light sources, thereby suppressing a rise in internal temperature of the housing.

DESCRIPTION OF EMBODIMENTS

Embodiments of the present invention will hereinafter be described with reference to the accompanying drawings.

First Embodiment

Figure 1:
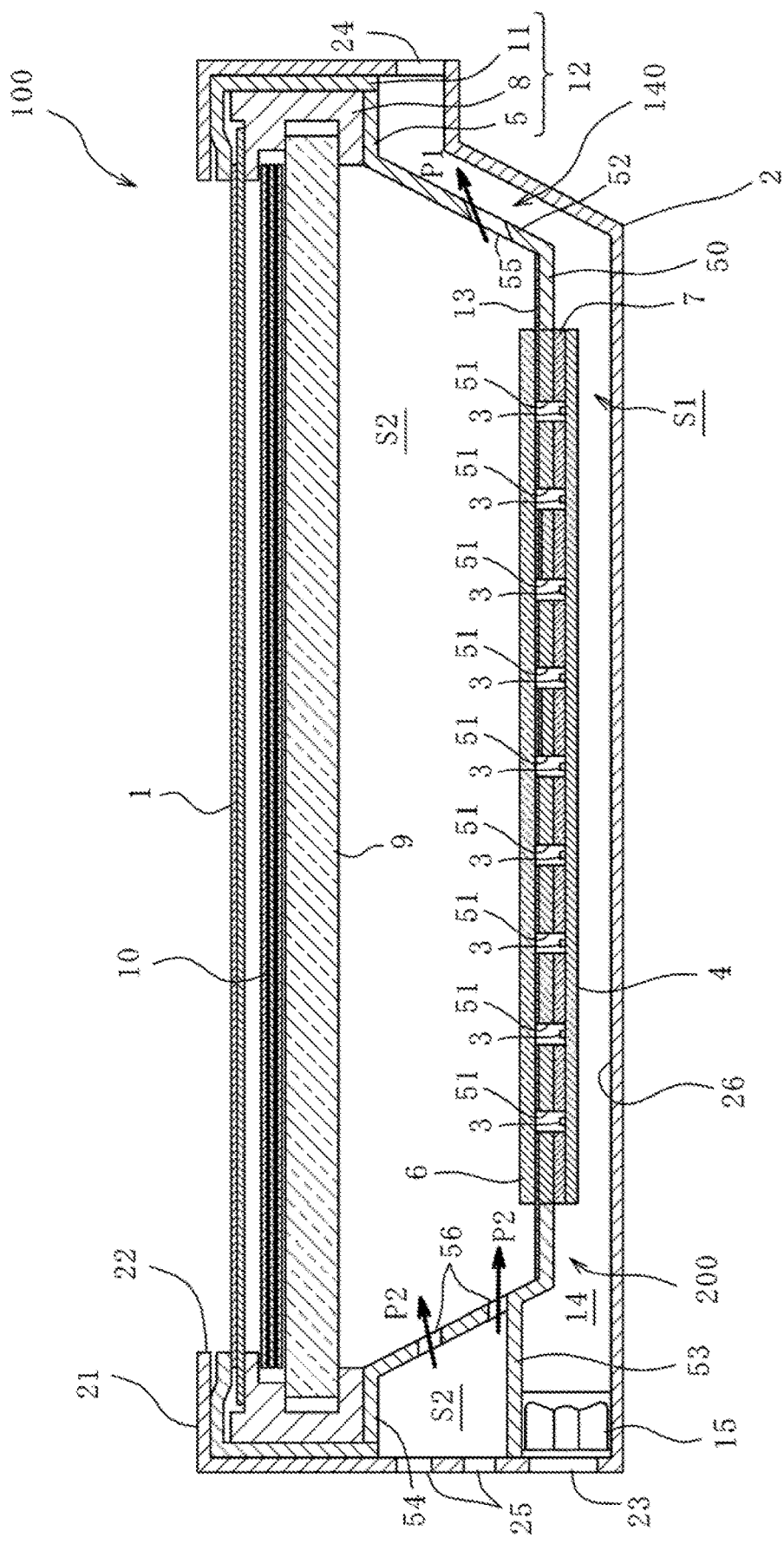
FIG. 1 is a cross-sectional view of a display apparatus according to a first embodiment.

FIG. 1 is a cross-sectional view of a liquid-crystal display apparatus (display apparatus) 100 according to a first embodiment. The liquid-crystal display apparatus 100 includes a liquid-crystal panel (display panel) 1 that displays an image (including a moving image), a backlight (illuminating device) 200 that emits light toward the liquid-crystal panel 1, and an enclosure that houses these components.

The backlight 200 includes light emitting diodes (LEDs) 3 as an example of light sources, a substrate 4 on which the LEDs 3 are mounted, and a back chassis 5.

The LEDs 3 are disposed on a surface of the substrate 4 in rows and columns. The number of the LEDs mounted on the surface of the substrate 4 is set such that the number allows the desired luminance to be achieved. In the present embodiment, the pitch between the LEDs 3 is made sufficiently small in particular in order to realize the high-luminance liquid-crystal display apparatus 100. Making the pitch between the LEDs 3 sufficiently small enables the realization of the high-luminance liquid-crystal display apparatus 100 and the suppression of non-uniform brightness in the liquid-crystal panel 1.

The substrate 4 is preferably composed of metal with a high thermal conductivity such as aluminum from the viewpoint of heat dissipation. Here, in the present specification, the heat dissipation includes release of heat held by the liquid-crystal display apparatus 100 to the outside of the liquid-crystal display apparatus 100. A rise in temperature of the liquid-crystal panel 1 is suppressed as a result of the heat dissipation. A copper foil patterns 40 is formed on the surface of the substrate 4, and constitutes wiring for feeding an electric current to the LEDs 3 (see FIG. 2). The wiring formed of the copper foil pattern 40 is electrically connected to an unillustrated driver circuit. The LEDs 3 convert electric power supplied from the driver circuit into light, thereby emitting light.

The back chassis 5 has a bottom plate section 50, a side plate section 52, an elongated section 53, and a flange 54. The bottom plate section 50 has a flat surface that is rectangular. The side plate section 52 is diagonally raised from peripheral edges of the bottom plate section 50. The elongated section 53 is elongated from the side plate section 52 in parallel with the bottom plate section 50. The flange 54 has a frame shape and is elongated from a peripheral edge of the side plate section 52 to spread parallel to the flat surface of the bottom plate section 50.

Through holes 51 (see FIG. 2) are formed at the bottom plate section 50 such that respective positions of the through holes 51 correspond to respective positions on the substrate 4 of optical axes of the LEDs 3. Each of the through holes 51 is circular in shape in a plane perpendicular to a direction penetrating the bottom plate section 50. The side plate section 52 is provided with a first opening 55 and second openings 56 which communicate the inside of the back chassis 5 with the outside of the back chassis 5. For example, the first and second openings 55 and 56 have a slit shape and are extended over respective faces of the side plate section 52. Alternatively, each of the first and second openings 55 and 56 may be, for example circular holes, or be formed at the bottom plate section 50. Although the first opening 55 may be perpendicular to the side plate section 52, it is preferable that the first opening 55 be inclined relative to the side plate section 52 so as to be along an air flow inside a duct 14 to be described later. The elongated section 53 is elongated from the side plate section 52 to the enclosure 2, and separates an internal space of the enclosure 2 into an area forming the duct 14 and an area not forming the duct 14. Note that the elongated section 53 may be formed separately from the back chassis 5 so as not to be part of the back chassis 5.

In the present specification, the term "outward" means a direction away from the member in question, and the term "inward" means a direction opposite thereto (e.g., a direction of the center of gravity of the member). Unless stated otherwise, surfaces facing outward and inward in each of members constituting the display apparatus 100 are called external and internal surfaces, respectively. For example, a surface, facing outward relative to the back chassis 5, of the bottom plate section 50 is called an external surface of the bottom plate section 50, and a surface facing an opposite direction thereto (opposite surface) is called an internal surface of the bottom plate section 50. Similarly, a surface, facing outward relative to the hack chassis 5, of the side plate section 52 is called an external surface of the side plate section 52, and an opposite surface thereto is called an internal surface. In the present embodiment, the substrate 4 is disposed outside the bottom plate section 50 of the back chassis 5, The substrate 4 is screwed to and held by the bottom plate section 50 of the back chassis 5.

Figure 2:
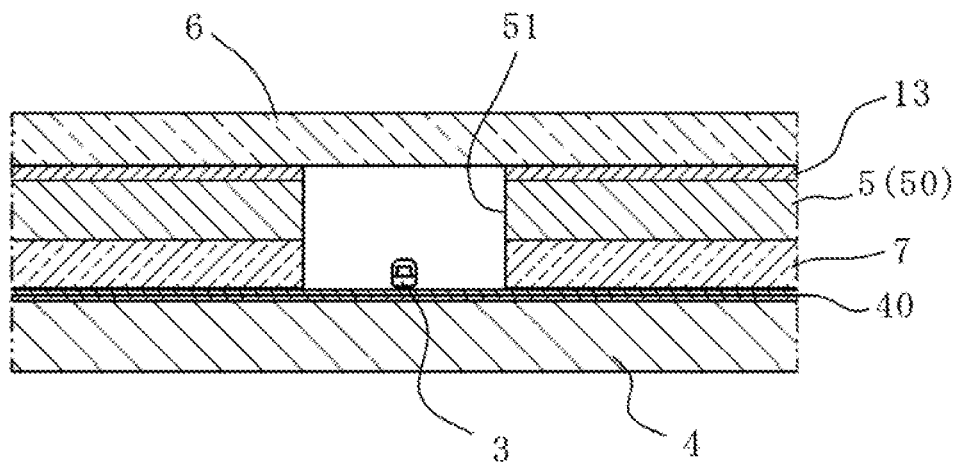
FIG. 2 is a cross-sectional view depicting a configuration of part of the display apparatus according to the first embodiment.

Thermal insulation 7 that is sheet insulation is adhered to the external surface of the bottom plate section 50 of the back chassis 5 except respective places in which the through holes 51 are formed (see FIG. 2). The thermal insulation 7 is disposed between the back chassis 5 and the substrate 4, thereby suppressing thermal conduction from the substrate 4 to the back chassis 5.

A reflection sheet 13 that reflects light is adhered to almost the entire internal surface of the bottom plate section 50 of the back chassis 5 except respective places in which the through holes 51 are formed (see FIG. 2). The plate member 6 is stacked on the bottom plate section 50 from the inside of the back chassis 5 and closes the through holes 51 (see FIG. 2). Specifically, the plate member 6 is placed on the internal surface of the bottom plate section 50 of the hack chassis 5 through the reflection sheet 13. The plate member 6 is, for example one rectangular plate. Alternatively, plate members 6 may be disposed side by side on the bottom plate section 50 of the back chassis 5. The plate member 6 is made of a resin material such as transparent acrylic, and has optical permeability. The plate member 6 may be fixed to the back chassis 5 by screwing. Note that the plate member 6 may not be necessarily provided.

FIG. 2 is a cross-sectional view depicting a configuration of part of the display apparatus 100 according to the present embodiment. The LEDs 3 are disposed inside their respective corresponding through holes 51. The entire surface of the substrate 4 is in contact with the external surface of the bottom plate section 50 of the back chassis 5 (through the thermal insulation 7). The present configuration is therefore effective from the viewpoint of dust prevention because there is substantially no gap between the back chassis 5 and the substrate 4.

As illustrated in FIG. 1, a panel chassis 8 has a rectangular frame shape whose outline substantially equals that of the back chassis 5, and is in contact with the back chassis 5 with their respective outer edges aligned.

A diffusion plate 9 has front and back surfaces (first and second surfaces) that are rectangular, and side surfaces surrounding the front and back surfaces. The diffusion plate 9 is disposed parallel to the bottom plate section 50. Each entire side surface of the diffusion plate 9 is fitted in a corresponding groove formed at an inner periphery of the panel chassis 8, and thereby the diffusion plate 9 is held by the panel chassis 8. The diffusion plate 9 is made of, for example a transparent resin material such as acrylic containing a light diffusion material. Specifically, the "containing a light diffusion material" means manufacture by using material in which particles that can scatter light are dispersed.

The diffusion plate 9 diffuses, in the inside of the diffusion plate 9, light struck on a back surface (surface close to the bottom plate section 50 of the back chassis 5) of the diffusion plate 9, and emits it from the front surface (surface close to the liquid-crystal panel 1).

In the present specification, from the viewpoint of directions, term "front" means a direction from the liquid-crystal display apparatus 100 toward a user, namely an image display direction of the liquid-crystal display apparatus 100, and "back" means an opposite direction thereto. Unless stated otherwise, a surface directed forward and a surface directed backward in members constituting the display apparatus 100 are called a first surface and a second surface, respectively. That is, the diffusion plate 9 diffuses, in the inside of the diffusion plate 9, light struck on the second surface, and then emits it from the first surface.

An optical sheet laminate 10 is provided so as to face the first surface of the diffusion plate 9. The optical sheet laminate 10 includes the laminated sheets which include one transparent diffusion sheet that diffuses incoming light to homogenize luminance, and two transparent prism sheets that align respective directions of rays of the incoming light in a single direction, The liquid-crystal panel 1 is disposed to face the first surface of the panel chassis 8 to close the entire opening of the panel chassis 8. A periphery on the second surface of the liquid-crystal panel 1 is in contact with the first surface of the panel chassis 8. In the liquid-crystal panel 1, a surface far from the back chassis 5 (i.e., the first surface of the liquid-crystal panel 1) is a display surface that displays an image.

A bezel 11 has a frame shape with an L-shaped cross section, and is provided to cover an outer circumferential surface of the panel chassis 8 and a periphery of the liquid-crystal panel 1. That is, the liquid-crystal panel 1 is sandwiched between the panel chassis 8 and the bezel 11. Note that the back chassis 5, the panel chassis 8, and the bezel 11 constitute a housing 12.

As illustrated in FIG. 1, the enclosure 2 has a substantially box shape, and houses the liquid-crystal panel 1, the diffusion plate 9, the substrate 4, and the housing 12. The enclosure 2 has a frame-shaped architrave section 21 in the front of the enclosure 2. Herein, an opening 22 is formed at the architrave section 21, and allows the display surface of the liquid-crystal panel 1 to be viewed from the outside. The back chassis 5 partitions the internal space of the enclosure 2 such that along with the enclosure 2, the back chassis 5 defines a first space S1 at a backward of the back chassis 5 (outside the back chassis 5), and a second space S2 at a frontward of the back chassis 5 (inside the back chassis 5). Here, the second space S2 on the front side includes an internal space of the housing 12, which is defined by the bottom plate section 50, the side plate section 52, and the diffusion plate 9.

A first air inlet (air inlet) 23 and an air outlet 24 are formed at the side surfaces of the enclosure 2. The first air inlet 23 and the air outlet 24 communicate the first space S1 in the enclosure 2 with the outside of the enclosure 2. Second air inlets 25 are also formed at the side surfaces of the enclosure 2. The second air inlets 25 communicate the second space S2 in the enclosure 2 with the outside of the enclosure 2. Each of the first air inlet 23, the second air inlets 25, and the air outlet 24 has, for example, a slit shape and is extended over a corresponding side surface of the enclosure 2.

In the present embodiment, the duct 14 is formed between the bottom plate section 50 of the back chassis 5, and a facing section 26 of the enclosure that faces the bottom plate section 50. In other words, the first space S1 in the enclosure 2 accords with an internal space of the duct 14, and the duct 14 is elongated from the first air inlet 23 through the air outlet 24.

A fan (air flow generator) 15 that generates an air flow inside the duct 14 is disposed in the first space S1 in the enclosure 2. In the present embodiment, the fan 15 is disposed in the vicinity of the first air inlet 23 in the duct 14 in order to draw, inside the duct 14, air from the first air inlet 23. The type of fan 15 may be, for example an axial fan, or alternatively a centrifugal fan.

In the duct 14, the fan 15 generates an air flow by which the Venturi effect that actively expels the air in the housing 12 from the first opening 55 occurs around the first opening 55. The section configured to cause the Venturi effect to occur is called a venturi section 140.

A light path in the liquid-crystal display apparatus 100 having the above-described structure will be described. Light emitted from each of the LEDs 3 passes through a corresponding through hole 51, and then travels inside the housing 12. The light traveling inside the housing 12 enters the diffusion plate 9 from the second surface directly or indirectly after being reflected by the reflection sheet 13. The light traveling inside the diffusion plate 9 is diffused and homogenized inside the diffusion plate 9, and then emitted from the first surface. The light homogenized by the diffusion plate 9 enters the optical sheet laminate 10. As stated above, the light traveling inside the optical sheet laminate 10 is further homogenized, while respective traveling directions of rays of the light are aligned with a normal direction to the optical sheet laminate 10. The light emitted from the optical sheet laminate 10 enters the liquid-crystal panel 1 from the second surface of the liquid-crystal panel 1. The liquid-crystal panel 1 controls optical transmittance per pixel unit according to an input signal from an unillustrated control circuit, thereby causing the display surface to display an image according to the input signal.

An air flow in the liquid-crystal display apparatus 100 having the above structure will also be described. The fan 15 generates an air flow in the duct 14 (i.e., the first space S1). Specifically, the air drawn inside the duct 14 from the first air inlet 23 flows toward the air outlet 24 to exit outside the duct 14 from the air outlet 24. In the second space S2, while the air therein is being expelled from the first opening 55 toward the first space S1 by the Venturi effect, the air being drawn from the second openings 56 flows toward the first opening 55. Here, a flow channel of the air expelled from the first opening 55 so as to flow from the inside to the outside of the housing 12 is called a first flow channel P1, while a flow channel of the air drawn from each of the second openings 56 so as to flow from the outside to the inside of the housing 12 is called a second flow channel P2.

The effects derived from the operation of the liquid-crystal display apparatus 100 stated above will be described.

As stated above, although displaying an image through the liquid-crystal display apparatus 100 needs to supply electric power to the LEDs 3 to be lit, part of the electric power supplied to the LEDs 3 is released inside the housing 12 as heat. The configuration of the present embodiment defines the first and second flow channels P1 and P2 as stated above, thereby making it possible to generate an air flow from the second openings 56 toward the first opening 55 such that air is drawn inside the housing 12 from the second openings 56, and then expelled outside the housing 12 from the first opening 55. The configuration therefore enables release, outside the housing 12, of the internal air of the housing 12 heated by the heat from the LEDs 3, thereby suppressing a rise in internal temperature of the housing 12. The above configuration enables generation of an air flow inside the housing 12 without providing another fan 15 inside the housing 12 in particular. It is therefore possible to prevent enlargement of the housing 12 and improve heat dissipation ability.

In the present embodiment, the substrate 4 on which the LEDs 3 are mounted is disposed outside the housing 12. The heat held by the LEDs 3 forming a heat source is transferred to the substrate 4 disposed outside the housing 12. A rise in internal temperature of the housing 12 is therefore suppressed. The embodiment is also configured such that the respective optical axes of the LEDs 3 are positioned in the respective through holes 51 in the bottom plate section 50 of the housing 12. Therefore, even if the substrate 4 is disposed outside the housing 12, light emitted from each of the LEDs 3 passes through a corresponding through hole 51 in the bottom plate section 50 of the housing 12, and then enters the inside of the housing 12.

Also, in the present embodiment, the plate member 6 makes it possible to suppress the occurrence of a turbulent flow in the internal space S2 of the housing 12, namely a sudden change in the air flow from the second openings 56 toward the first opening 55. In other words, it is possible to rectify the air flow in the internal space S2 of the housing 12. It is therefore possible to efficiently release the internal air of the housing 12 heated by the heat from the light sources, thereby suppressing a rise in the internal temperature of the housing 12.

Various variations of the present embodiment will hereinafter be described with reference to FIGS. 3A to 4B.

Figure 3A:
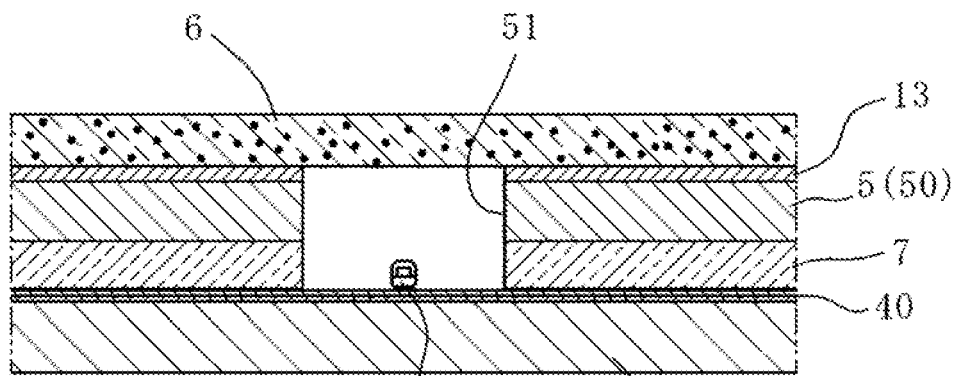
FIG. 3A is a cross-sectional view depicting a first variation of a plate member in FIG. 2.

FIG. 3A is a cross-sectional view depicting a first variation of the plate member 6 in FIG. 2. A plate member 6 in the present variation contains a light scattering material. Here, the plate member 6 containing the light scattering material means that the plate member 6 is manufactured by curing a material in which particles that allow light to be scattered are dispersed.

The present variation makes it possible to successfully diffuse light inside a housing 12 to homogenize luminance of a liquid-crystal panel 1 as a result of the plate member 6 containing the light scattering material. Here, the plate member 6 containing the light scattering material means that optical scattering particles are dispersed in the material of the plate member 6.

Figure 3B:
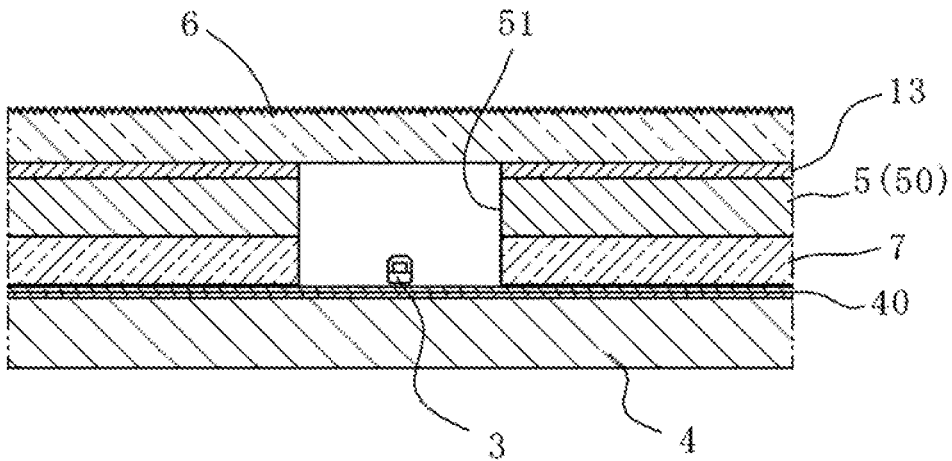
FIG. 3B is a cross-sectional view depicting a second variation of the plate member in FIG. 2.

FIG. 3B is a cross-sectional view depicting a second variation of the plate member 6 in FIG. 2. A plate member 6 in the present variation has an embossed surface that is an opposite surface of the plate member 6 from a surface of the plate member 6 facing a bottom plate section 50.

The present variation makes it possible to successfully diffuse light inside a housing 12 to homogenize luminance of a liquid-crystal panel 1 as a result of the plate member 6 having a front surface that is embossed.

Figure 3C:
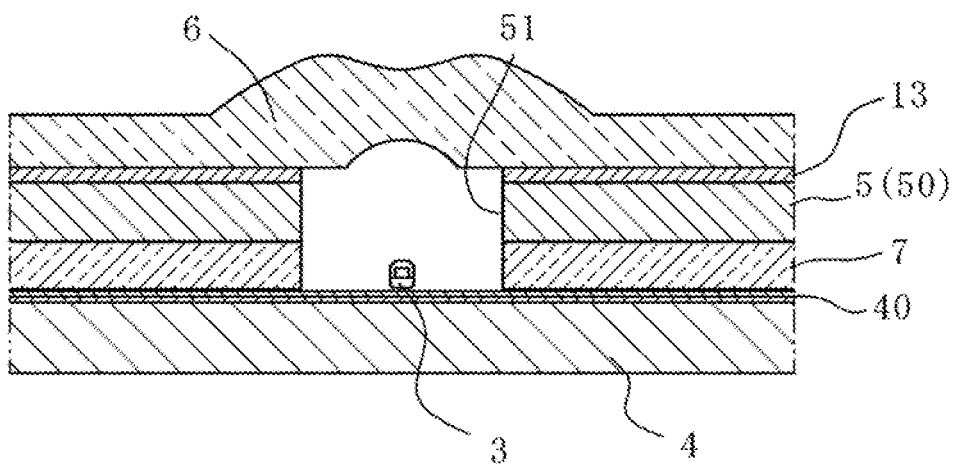
FIG. 3C is a cross-sectional view depicting a third variation of the plate member in FIG. 2.

FIG. 3C is a cross-sectional view depicting a third variation of the plate member 6 in FIG. 2. In the present variation, a plate member 6 is provided with optical diffusing lens structures on a front surface of the plate member 6, each of which is formed along the optical axis of a corresponding LED 3 of LEDs 3. Here, each optical diffusing lens structure means a structure having a function of diffusing light.

The present variation makes it possible to successfully diffuse light inside a housing 12 to further homogenize luminance of a liquid-crystal panel 1 as a result of the plate member 6 being provided with the optical diffusing lens structures.

Figure 4A:
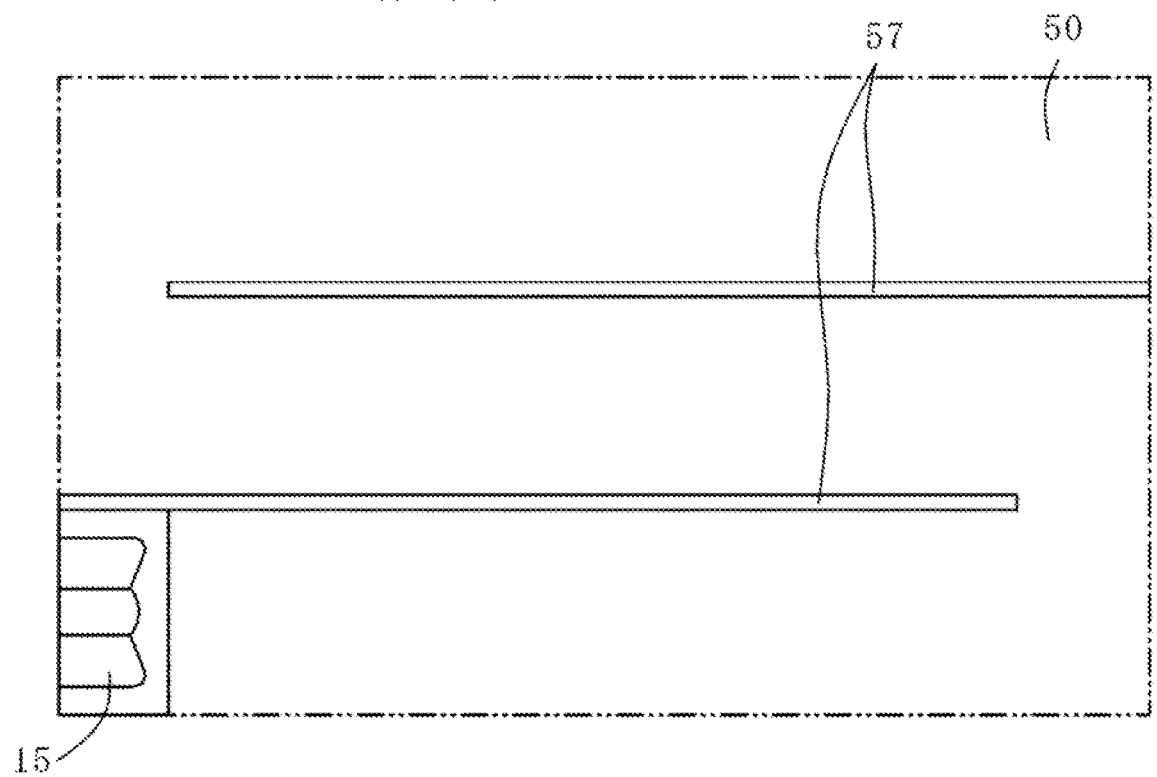
FIG. 4A is a schematic illustration depicting a first variation of a duct provided on a back surface of a back chassis in FIG. 1.

FIG. 4A is a schematic illustration depicting a first variation of the duct 14 on the back surface of the back chassis 5 in FIG. 1. In the present variation, fin-shaped projections 57 are formed on a bottom plate section 50. The projections 57 constitute a folded structure in a duct 14. The fin-shaped projections 57 are elongated from the bottom plate section 50 to a facing section 26 of an enclosure 2 facing the bottom plate section 50, and in contact with the facing section 26. That is, the duct 14 in the present variation is composed of the projections 57 between the bottom plate section 50 and the facing section 26. Although not shown, a first air inlet 23 is formed at the proximal end of the duct 14 from a fan 15, while an air outlet 24 is formed at the distal end of the duct 14 from the fan 15. A venturi section 140 is formed at a position away from the fan 15 (proximal to the air outlet 24).

The present variation enables an increase of the overall length of the duct 14 by one or more turns, thereby improving the effect of forced air cooling by an air flow in the duct 14. The air flow in the duct 14 is necessary for exhibiting the Venturi effect in the venturi section 140, and itself contributes to cooling the inside of the duct 14 and the vicinity of the duct 14. Increasing the overall length of the duct 14 as shown by the structure of the present variation enables securing of a long flow channel for forced air cooling, thereby improving the cooling effect.

Figure 4B:
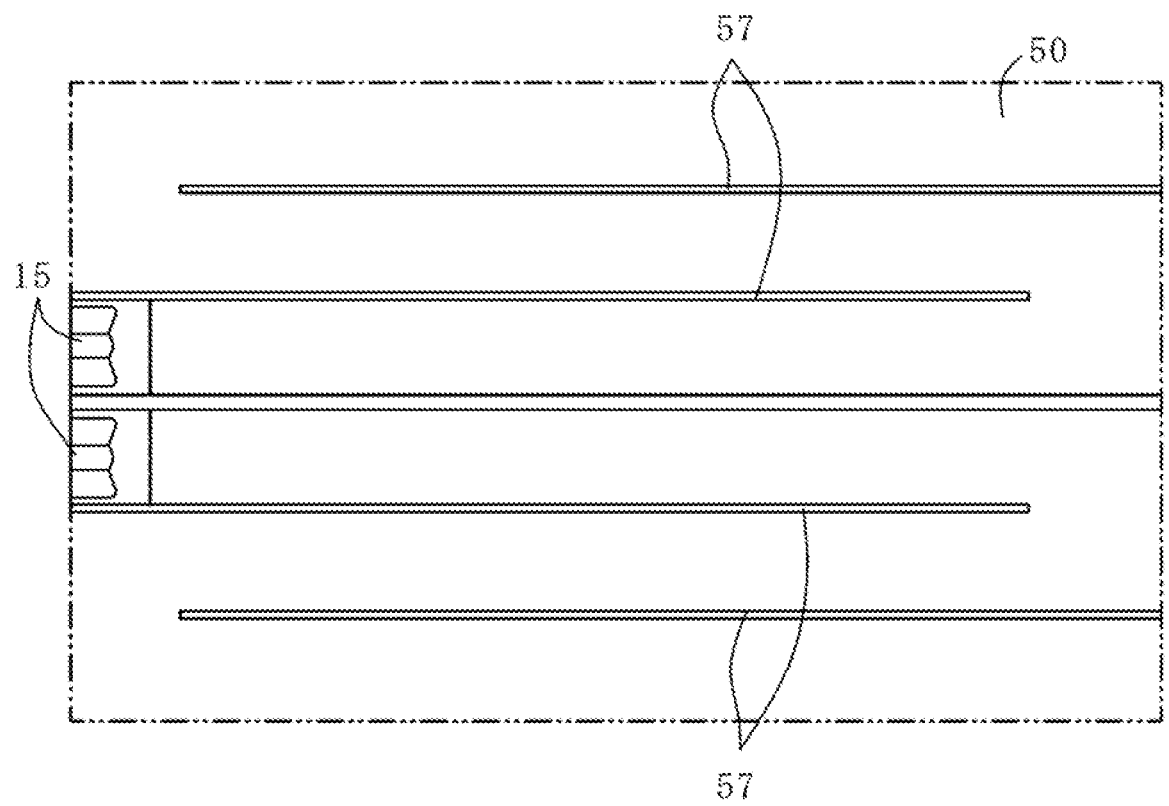
FIG. 4B is a schematic illustration depicting a second variation of the duct provided on the back surface of the back chassis in FIG. 1.

FIG. 4B is a schematic illustration depicting a second variation of the duct 14 on the back surface of the back chassis 5 in FIG. 1. A duct 14 in the present variation may be divided into two parts. Two (pair of) fans 15 are accordingly provided, and first air inlets 23, air outlets 24, and venturi sections 140 are also provided one pair each. The effect by the present variation is similar to that by the first variation. Note that unlike the structure shown in FIGS. 4A and 4B, the duct 14 may have a swirl structure as a whole.

Instead of the present variation, fin-shaped projections may be formed on the facing section 26 of the enclosure 2. In this case, the fin-shaped projections are elongated to the bottom plate section 50 and in contact with the bottom plate section 50. Alternatively, fin-shaped projections may be formed on both the bottom plate section 50 and the facing section 26 of the enclosure 2. In this case, projections on the bottom plate section 50 and projections on the facing section 26 are elongated such that their respective tips are in contact with each other.

Second Embodiment

Figure 5:
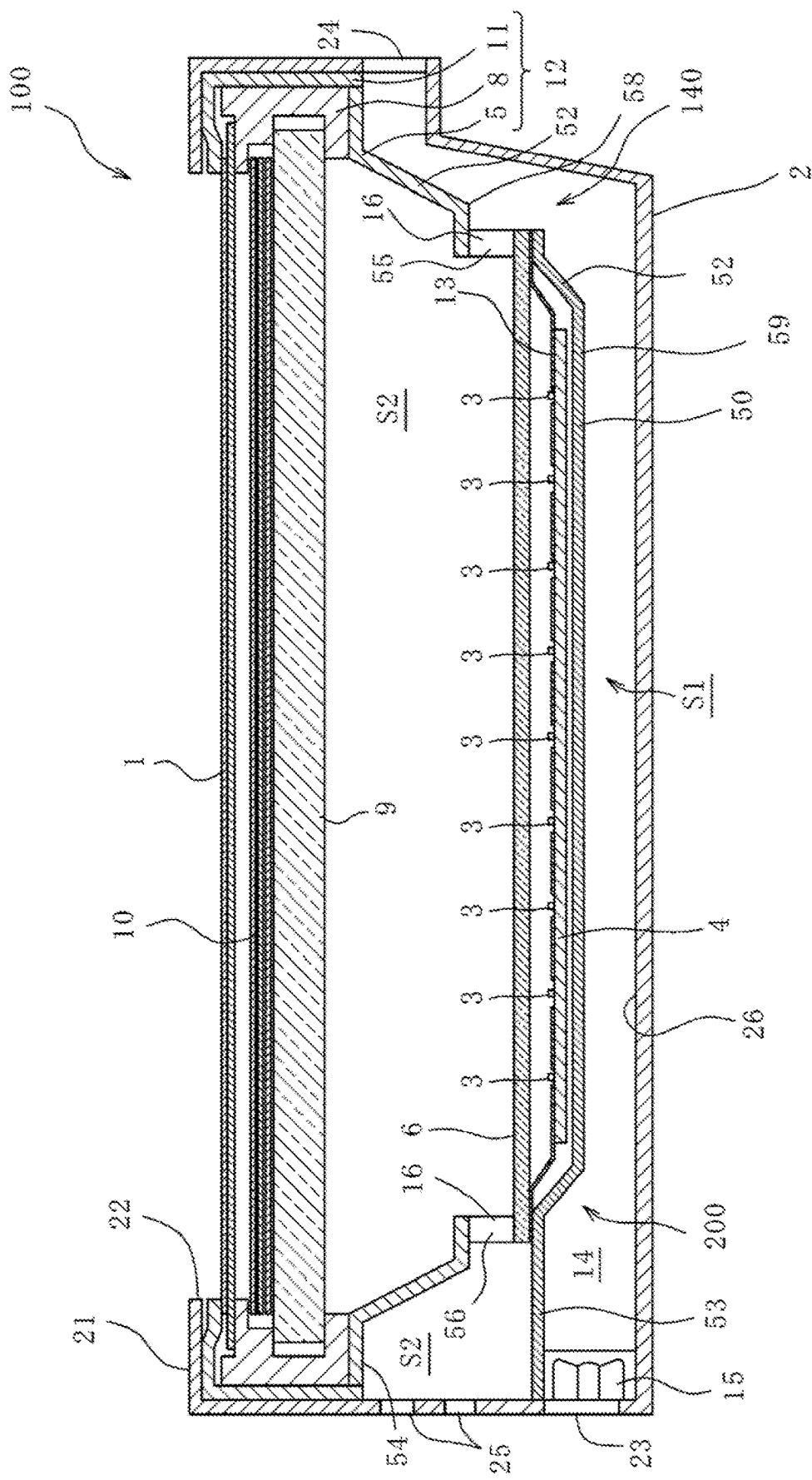
FIG. 5 is a cross-sectional view of a display apparatus according to a second embodiment.

FIG. 5 is a cross-sectional view of a liquid-crystal display apparatus 100 according to a second embodiment. The liquid-crystal display apparatus 100 according to the present embodiment illustrated in FIG. 5 has a back chassis 5 whose structure is different from that of the first embodiment. The embodiment has a similar configuration to that of the liquid-crystal display apparatus 100 according to the first embodiment in FIGS. 1 and 2, other than the configuration of the back chassis 5. Therefore, the same components as those shown in FIGS. 1 and 2 are denoted by the same reference numerals, and description thereof is omitted.

In the present embodiment, the back chassis 5 is separated into a first chassis 58 and a second chassis 59 in a side plate section 52.

The first chassis 58 has a flange 54, and the side plate section 52, and an end of the side plate section 52 is bent parallel to a bottom plate section 50. The second chassis 59 has the side plate section 52, the bottom plate section 50, and an elongated section 53, and the end of the side plate section 52 are bent parallel to the bottom plate section 50. The present embodiment differs from the first embodiment in that no through holes 51 are provided at the bottom plate section 50 and a substrate 4 is disposed inside a housing 12. Specifically, the substrate 4 is disposed, with a reflection sheet 13 adhered to a surface of the substrate 4, above an internal surface of the bottom plate section 50, and screwed to the bottom plate section 50.

In addition, a plate member 6 in the present embodiment is disposed parallel to the bottom plate section 50 between the first chassis 58 and the second chassis 59. The reflection sheet 13 is also sandwiched between the plate member 6 and the side plate section 52 of the second chassis 59.

A spacer 16 is provided between the first chassis 58 and the second chassis 59, and the first chassis 58 and the second chassis 59 are separated from each other. The first chassis 58 and the second chassis 59 are screwed to each other through the plate member 6, the reflection sheet 13, and the spacer 16.

In the present embodiment, gaps provided by the spacer 16 between the first chassis 58 and the second chassis 59 form a first opening 55 and a second opening 56.

The substrate 4 may be disposed inside the housing 12 like the present embodiment. It is thereby possible to eliminate additional processing such as providing the through holes 51 in the bottom plate section 50, and providing the first and second openings 55 and 56 in the side plate section 52.

Figure 6:
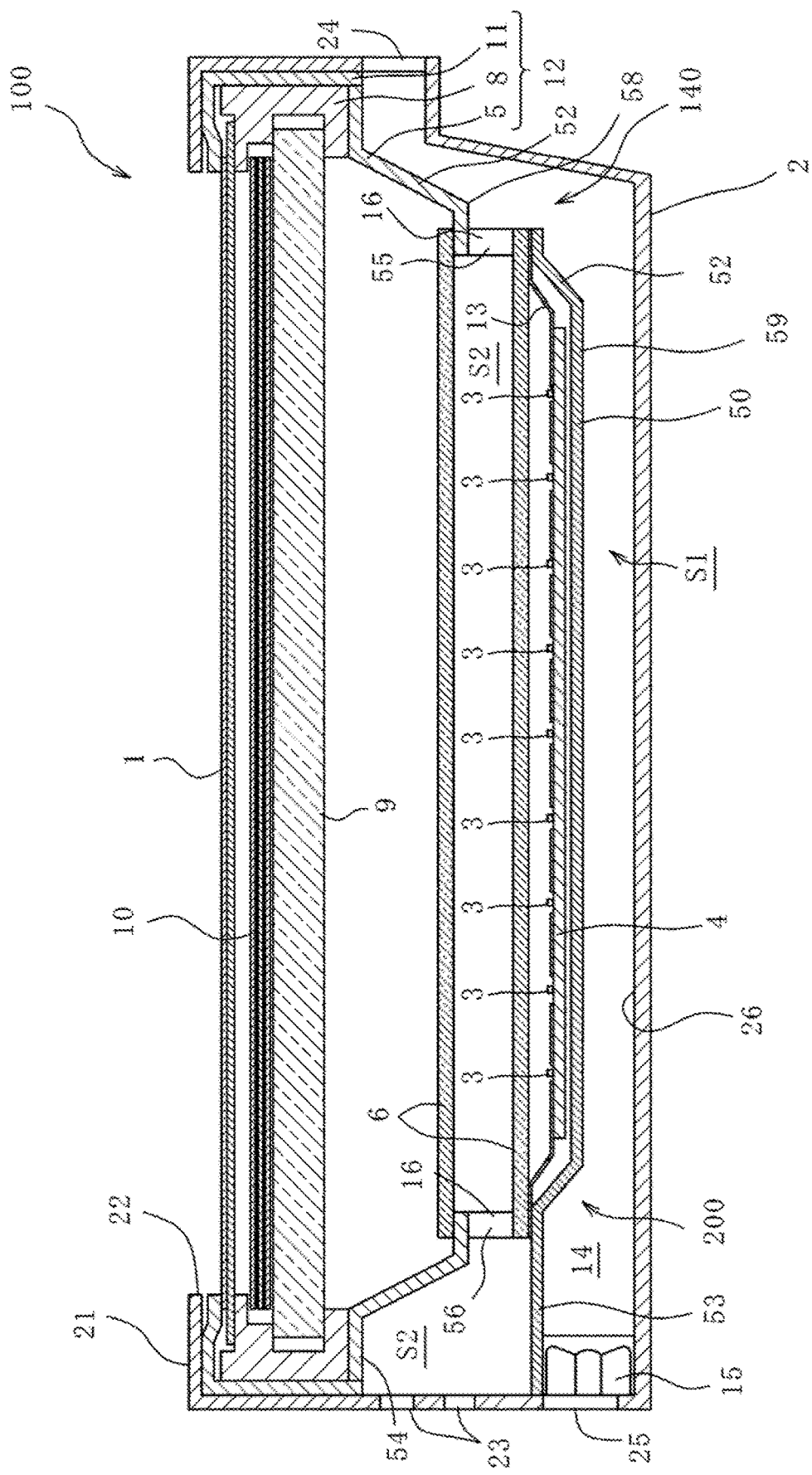
FIG. 6 is a cross-sectional view depicting a variation of the display apparatus according to the second embodiment.

FIG. 6 is a cross-sectional view of a liquid-crystal display apparatus 100 according to a variation of the second embodiment. In the present variation, a plate member 6 is disposed inside a first chassis 58 so as to face a diffusion plate 9. That is, the present variation is provided with two plate members 6.

The two plate members 6 may be provided like the present variation. The two plate members 6 enables improvement in rectification of an air flow from a second opening 56 toward a first opening 55.

Third Embodiment

Figure 7:
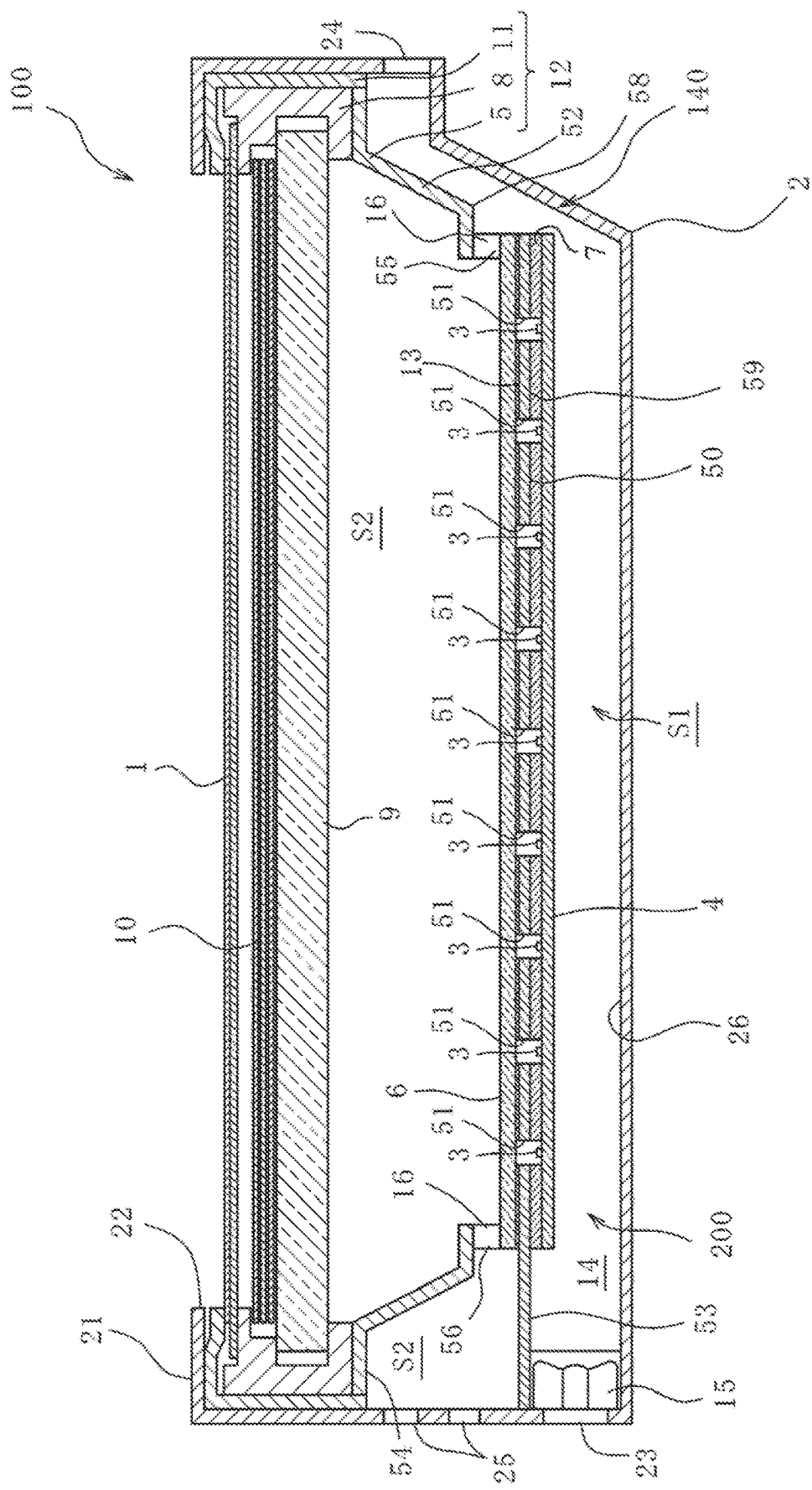
FIG. 7 is a cross-sectional view of a display apparatus according to a third embodiment.

FIG. 7 is a cross-sectional view of a liquid-crystal display apparatus 100 according to a third embodiment. The liquid-crystal display apparatus 100 according to the present embodiment illustrated in FIG. 7 has a back chassis 5 whose configuration is different from that of the first embodiment. The present embodiment has a similar configuration to that of the liquid-crystal display apparatus 100 according to the first embodiment in FIGS. 1 and 2, other than the configuration of the back chassis 5. Therefore, the same components as those shown in FIGS. 1 and 2 are denoted by the same reference numerals, and description thereof is omitted.

In the present embodiment, the back chassis 5 is separated into a first chassis 58 and a second chassis 59 in the side plate section 52.

The first chassis 58 has a flange 54 and the side plate section 52. An end of the side plate section 52 is bent parallel to a bottom plate section 50. The second chassis 59 has a rectangular plate shape with the bottom plate section 50 and an elongated section 53. Specifically, part of the bottom plate section 50 is the elongated section 53. In the present embodiment, like the first embodiment, through holes 51 are provided at the bottom plate section 50 and a substrate 4 is disposed outside a housing 12. Specifically; the substrate 4 is disposed outside the bottom plate section 50 with a reflection sheet 13 adhered to a surface of the bottom plate section 50, and screwed to the bottom plate section 50.

A spacer 16 is provided between the first chassis 58 and the second chassis 59, and the first chassis 58 and the second chassis 59 are separated from each other. The first chassis 58 and the second chassis 59 are screwed to each other through a plate member 6, the reflection sheet 13, and the spacer 16.

In the present embodiment, gaps provided by the spacer 16 between the first chassis 58 and the second chassis 59 form a first opening 55 and a second opening 56.

The second chassis 59 may be a simple plate member like the present embodiment. That is, the back chassis 5 may be formed by a simple configuration.

Figure 8:
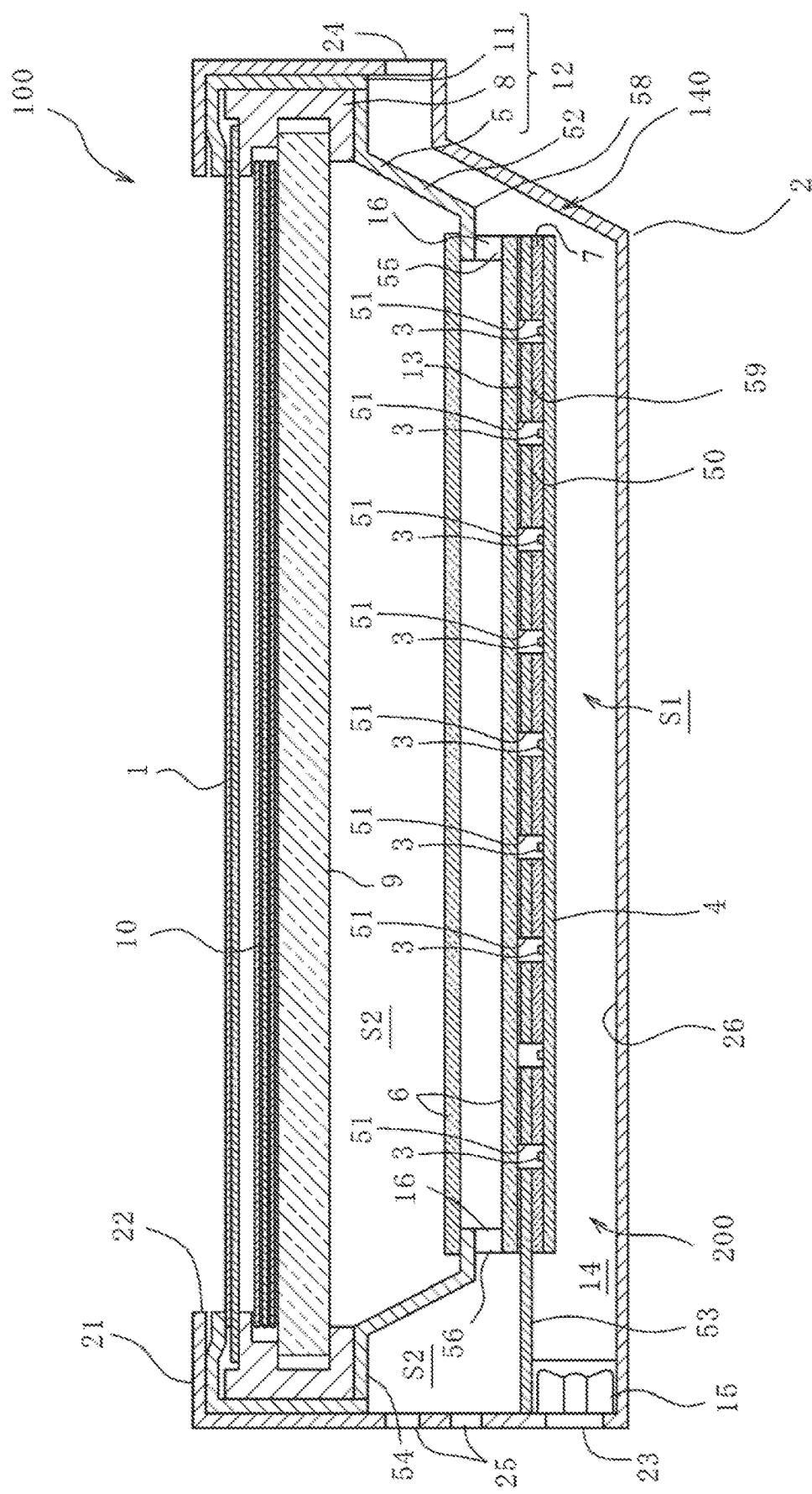
FIG. 8 is a cross-sectional view of a variation of the display apparatus according to the third embodiment.

FIG. 8 is a cross-sectional view f a liquid-crystal display apparatus 100 according to a variation of the third embodiment. A plate member 6 in the present variation is disposed inside a first chassis 58 so as to face a diffusion plate 9. That is, the present variation includes two plate members 6.

Two plate members 6 may be provided like the present variation. The two plate members 6 enables improvement in rectification of an air flow from a second opening 56 toward a first opening 55.

Preferable embodiments of the present invention are shown below.

An illuminating device according to an embodiment of the present invention includes a substrate, a housing, a diffusion plate, a duct, an air flow generator, a venturi section, a first flow channel, and a second flow channel. The substrate has a surface on which light sources are mounted. The housing has a bottom plate section that holds the substrate, and a side plate section that surrounds the bottom plate section. Herein, an opening is defined by an end of the side plate section. The diffusion plate is disposed to face the bottom plate section, and closes the opening. The duct has an air inlet and an air outlet. The air flow generator generates an air flow inside the duct. The venturi section is formed between the air inlet and the air outlet of the duct such that an internal space of the housing closed with the diffusion plate communicates with an inside of the duct. The first flow channel is connected through a first opening provided at the bottom plate section or the side plate section. In the second flow channel, through a second opening provided in the bottom plate section or the side plate section, an outside of the housing is not connected to the duct but communicates with an inside of the housing.

In this configuration, the first flow channel is provided such that the internal space of the housing communicates with the venturi section in the duct through the first opening. The air flow is generated in the duct by the air flow generator. The Venturi effect accordingly occurs in the first flow channel such that the internal air of the housing is expelled outside the housing from the first opening along with the air flow in the duct. In the second flow channel, the internal space of the housing does not communicate with the inside of the duct through the second opening, and the Venturi effect does not occur unlike the above. The internal air of the housing is therefore not expelled outside the housing from the second opening. In other words, in the second flow channel, air outside the housing is drawn inside the housing from the second opening. Thus, it is possible to generate an air flow from the second opening toward the first opening such that in the internal space of the housing, air is drawn inside from the second opening and then expelled outside from the first opening. It is therefore possible to release, outside the housing, the internal air of the housing heated by heat from the light sources, thereby suppressing a rise in internal temperature of the housing. The above configuration enables generation of an air flow inside the housing without providing any air flow generator inside the housing in particular, thereby preventing enlargement of the housing and improving heat dissipation ability.

In one aspect, the duct may have one or more turns.

This configuration enables an increase of the overall length of the duct by the one or more turns, thereby improving the effect of forced air cooling by an air flow in the duct. The air flow in the duct is necessary for exhibiting the Venturi effect in the venturi section, and itself contributes to cooling the inside of the duct and the vicinity of the duct. Therefore, increasing the overall length of the duct like the above configuration enables securing of a long flow channel for forced air cooling and improvement in cooling effect.

In one aspect, through holes may be formed at the bottom plate section of the housing. The substrate is held by the bottom plate section of the housing outside the housing such that respective optical axes of the light sources correspond to the through holes.

In this configuration, the substrate on which the light sources are mounted is disposed outside the housing. Therefore, heat generated from the light sources is released outside the housing, and a rise in internal temperature of the housing is suppressed. Also, the respective axes of the light sources correspond to the through holes in the bottom plate section of the housing. Therefore, even if the substrate is disposed outside the housing, light emitted from each of the light sources passes through a corresponding through hole in the bottom plate section of the housing, and then enters the inside of the housing to strike a lighting target.

In one aspect, a plate member may be disposed to face the diffusion plate in the internal space of the housing.

In this configuration, the plate member makes it possible to suppress the occurrence of a turbulent flow in the internal space of the housing, namely a sudden change in the air flow from the second opening toward the first opening. In other words, it is possible to rectify the air flow in the internal space of the housing. It is therefore possible to release, outside the housing, the internal air of the housing heated by heat from the light sources, thereby suppressing a rise in internal temperature of the housing.

In one aspect, the plate member may contain a light scattering material.

This configuration makes it possible to successfully diffuse light inside the housing to homogenize luminance of the lighting target as a result of the plate member containing the light scattering material.

In one aspect, the plate member may have an embossed surface that is an opposite surface of the plate member from a surface of the plate member superposed on the bottom plate section.

This configuration makes it possible to successfully diffuse light inside the housing to homogenize luminance of the lighting target as a result of the plate member being provided with the embossed surface.

In one aspect, the plate member may be provided with optical diffusing lens structures, each of which is formed at a position along the optical axis of a corresponding light source of the light sources, on an opposite surface of the plate member from a surface of the plate member superposed on the bottom plate section.

This configuration makes it possible to successfully diffuse light inside the housing to homogenize luminance of the lighting target as a result of the plate member being provided with the optical diffusing lens structures.

A display apparatus according to an embodiment of the present invention includes the illuminating device, a display panel and an enclosure. The display panel has a display surface that displays an image. The display panel controls transmittance of light, incoming from an opposite surface of the display panel from the display surface through the diffusion plate, emitted from the light sources, thereby generating the image. The enclosure houses the display panel, the diffusion plate, the substrate, and the housing. The duct and the air flow generator are disposed between the bottom plate section and a facing section of the enclosure that faces the bottom plate section.

In this configuration, the structure of the illuminating device makes it possible to suppress a rise in internal temperature of the housing by heat generated from the light sources, thereby suppressing a rise in temperature of the display panel.

A display apparatus according to an embodiment of the present invention includes the illuminating device, a display panel and an enclosure. The display panel has a display surface that displays an image. The display panel controls transmittance of light, incoming from an opposite surface of the display panel from the display surface through the diffusion plate, emitted from the light sources, thereby generating the image. The enclosure houses the display panel, the diffusion plate, the substrate, and the housing, The air flow generator is disposed between the bottom plate section and a facing section of the enclosure that faces the bottom plate section. The duct is composed of fin-shaped projections formed on at least one of the bottom plate section, or the facing section.

In this configuration, the structure of the illuminating device makes it possible to suppress a rise in internal temperature of the housing by heat generated from the light sources, thereby suppressing a rise in temperature of the display panel. In addition, because the duct is composed of the fin-shaped projections formed on at least one of the bottom plate section, or the facing section, it is possible to form the duct by using the existing configuration without any new additional configuration.

Although as stated above specific embodiments of the present invention and variations thereof have been described, the present invention is not limited to the above embodiments, and may be implemented with various variations within the scope of the present invention. For example, an appropriate combination of contents of individual embodiments may be provided as an embodiment of the present invention.

REFERENCE SIGNS LIST

1 Liquid-crystal panel (Display panel)
2 Enclosure

21 Architrave section
22 Opening
23 First air inlet (Air inlet)
24 Air outlet
25 Second air inlet
26 Facing section
3 LED (Light source)
4 Substrate
40 Copper foil pattern
5 Back chassis
50 Bottom plate section
51 Through hole
52 Side plate section
53 Elongated section
54 Flange
55 First opening
56 Second opening
57 Projection
58 First chassis
59 Second chassis
6 Plate member
7 Thermal insulation
8 Panel chassis
9 Diffusion plate
10 Optical sheet laminate
11 Bezel
12 Housing
13 Reflection sheet
14 Duct
140 Venturi section
15 Fan (Air flow generator)
16 Spacer
100 Liquid-crystal display apparatus (Display apparatus)
200 Backlight (Illuminating device)

The invention claimed is:

1. An illuminating device comprising:
a substrate having a surface on which light sources are mounted;
a housing having a bottom plate section that holds the substrate, and a side plate section that surrounds the bottom plate section;
a diffusion plate disposed to face the bottom plate section, an internal space of the housing defined by the bottom plate section, the side plate section, and the diffusion plate;
a duct having an air inlet and an air outlet;
an air flow generator configured to generate an air flow inside the duct;
a venturi section formed between the air inlet and the air outlet of the duct and configured to cause a Venturi effect between an inside of the duct and the internal space of the housing;
a first opening provided in the bottom plate section or the side plate section of the housing;
a first flow channel in air communication between the internal space of the housing and an inside of the duct through the first opening;
a second opening provided in the bottom plate section or the side plate section, of the housing;
a second flow channel in air communication between an outside of the housing and the internal space of the housing through the second opening the second flow channel not in air communication with the duct; and
an enclosure housing the substrate and the housing, wherein
the air flow generator is disposed between an outer surface of the bottom plate section of the housing and an inner surface of the enclosure,
the duct is defined by the outer surface of the bottom plate section of the housing and the inner surface of the enclosure, and
the air inlet and the air outlet are formed at the enclosure.

2. The illuminating device according to claim 1, wherein a plate member is disposed to face the diffusion plate in the internal space of the housing.

3. The illuminating device according to claim 2, wherein the plate member has a light diffusing function.

4. The illuminating device according to claim 1, wherein through holes are formed in the bottom plate section of the housing, and
the substrate is held on the outer surface of the bottom plate section of the housing such that each of the light sources faces one of the through holes and an optical axis of each of the light sources passes through one of the through holes.

5. A display apparatus comprising an illuminating device, the illuminating device including:
a substrate having a surface on which light sources are mounted;
a housing having a bottom plate section that holds the substrate, and a side plate section that surrounds the bottom plate section;
a diffusion plate disposed to face the bottom plate section, an internal space of the housing defined by the bottom plate section, the side plate section, and the diffusion plate;
a duct having an air inlet and an air outlet;
an air flow generator configured to generate an air flow inside the duct;
a venturi section formed between the air inlet and the air outlet of the duct and configured to cause a Venturi effect between an inside of the duct and the internal space of the housing;
a first opening provided in the bottom plate section or the side plate section of the housing;
a first flow channel in air communication between the internal space of the housing and an inside of the duct through the first opening;
a second opening provided in the bottom plate section or the side plate section, of the housing;
a second flow channel in air communication between an outside of the housing and the internal space of the housing through the second opening the second flow channel not in air communication with the duct;
a display panel having a display surface that displays an image, the display panel configured to control transmittance of light, incoming from an opposite surface of the display panel from the display surface through the diffusion plate, emitted from the light sources, thereby generating the image; and
an enclosure housing the display panel, the diffusion plate, the substrate, and the housing, wherein
the air flow generator is disposed between an outer surface of the bottom plate section of the housing and an inner surface of the enclosure,
the duct is defined by the outer surface of the bottom plate section of the housing and the inner surface of the enclosure, and
the air inlet and the air outlet are formed at the enclosure.

6. The display apparatus according to claim 5, wherein a plate member is disposed to face the diffusion plate in the internal space of the housing.

7. The display apparatus according to claim 6, wherein the plate member has a light diffusing function.

8. The display apparatus according to claim 5, wherein the duct has one or more turns.

9. The display apparatus according to claim 5, wherein through holes are formed in the bottom plate section of the housing, and
the substrate is held on the outer surface of the bottom plate section of the housing such that each of the light sources faces one of the through holes and an optical axis of each of the light sources passes through one of the through holes.

10. The display apparatus according to claim 5, further comprising:
an elongated section elongated to outside the housing from the side plate section of the housing in parallel with the bottom plate section, wherein
the elongated section separates an external space of the housing into an area forming the duct and an area not forming the duct, and
the second opening is in air communication between the area not forming the duct and the internal space of the housing.

11. A display apparatus; comprising an illuminating device, the illuminating device including:
a substrate having a surface on which light sources are mounted;
a housing having a bottom plate section that holds the substrate, and a side plate section that surrounds the bottom plate section;
a diffusion plate disposed to face the bottom plate section, an internal space of the housing being defined by the bottom plate section, the side plate section, and the diffusion plate;
a duct having an air inlet and an air outlet;
an air flow generator configured to generate an air flow inside the duct;
a venturi section formed between the air inlet and the air outlet of the duct and configured to cause a Venturi effect between an inside of the duct and the internal space of the housing;
a first opening provided in the bottom plate section or the side plate section of the housing;
a first flow channel in air communication between the internal space of the housing and an inside of the duct through the first opening;
a second opening provided in the bottom plate section or the side plate section, of the housing;
a second flow channel in air communication between an outside of the housing and the internal space of the housing through the second opening the second flow channel not in air communication with the duct;
a display panel having a display surface that displays an image, the display panel configured to control transmittance of light, incoming from an opposite surface of the display panel from the display surface through the diffusion plate, emitted from the light sources, thereby generating the image; and
an enclosure housing the display panel, the diffusion plate, the substrate, and the housing, wherein
the air flow generator is disposed between an outer surface of the bottom plate section of the housing and an inner surface of the enclosure,
the duct is defined by the outer surface of the bottom plate section of the housing, the inner surface of the enclosure and fin-shaped projections, the projections are formed on at least one of the outer surface of the bottom plate section of the housing or the inner surface of the enclosure, and the projections protrude into the duct, and
the air inlet and the air outlet are formed at the enclosure.

12. The display apparatus according to claim 11, wherein a plate member is disposed to face the diffusion plate in the internal space of the housing.

13. The display apparatus according to claim 12, wherein the plate member has a light diffusing function.

14. The illuminating device according to claim 1, further comprising:
an elongated section elongated to outside the housing from the side plate section of the housing in parallel with the bottom plate section, wherein
the elongated section separates an external space of the housing into an area forming the duct and an area not forming the duct, and
the second opening is in air communication between the area not forming the duct and the internal space of the housing.

15. The display apparatus according to claim 11, wherein the duct has one or more turns.

16. The display apparatus according to claim 11, wherein through holes are formed in the bottom plate section of the housing, and
the substrate is held on the outer surface of the bottom plate section of the housing such that each of the light sources faces one of the through holes and an optical axis of each of the light sources passes through one of the through holes.

17. The display apparatus according to claim 11, further comprising:
an elongated section elongated to outside the housing from the side plate section of the housing in parallel with the bottom plate section, wherein
the elongated section separates an external space of the housing into an area forming the duct and an area not forming the duct, and
the second opening is in air communication between the area not forming the duct and the internal space of the housing.

* * * * *